United States Patent [19]

Ban

[11] 4,294,538
[45] Oct. 13, 1981

[54] IMAGE FORMING OPTICAL SYSTEM

[75] Inventor: Mikichi Ban, Yokohama, Japan

[73] Assignee: Canon Kabushiki Kaisha, Tokyo, Japan

[21] Appl. No.: 116,752

[22] Filed: Jan. 30, 1980

Related U.S. Application Data

[63] Continuation of Ser. No. 18,910, Mar. 9, 1979, abandoned.

[30] Foreign Application Priority Data

Mar. 18, 1978 [JP] Japan .................................. 53-31578
Mar. 18, 1978 [JP] Japan .................................. 53-31579

[51] Int. Cl.³ .................... G03B 27/48; G03B 27/50; G03B 27/70; G02B 21/18
[52] U.S. Cl. ...................................... 355/51; 350/27; 355/60; 355/63
[58] Field of Search .................. 355/8, 43, 51, 57, 60, 355/63, 65, 66; 356/393, 391, 394, 399; 350/30, 173, 174, 286, 172, 27, 55, 169

[56] References Cited

U.S. PATENT DOCUMENTS

| | | | |
|---|---|---|---|
| 3,758,774 | 9/1973 | Hildenbrandt | 355/8 X |
| 3,884,573 | 5/1975 | Franklin | 355/51 |
| 3,937,556 | 2/1976 | Newell | 350/30 |
| 3,951,546 | 4/1976 | Markle | 355/51 |
| 3,963,353 | 6/1976 | Hemstreet | 356/168 |
| 4,011,011 | 3/1977 | Hemstreet et al. | 355/51 X |
| 4,023,126 | 5/1977 | Schlafer | 355/51 |
| 4,215,934 | 8/1980 | Karasawa et al. | 355/51 |

Primary Examiner—Richard A. Wintercorn
Attorney, Agent, or Firm—Fitzpatrick, Cella, Harper & Scinto

[57] ABSTRACT

An optical system for forming a spot object or an arcuate object into an arcuate image or a spot image. This optical system has a band-like spherical mirror obtained by sectioning a concave spherical mirror. By the band-like spherical mirror, the spot object disposed on the rotational symmetry axis other than the center of curvature may be imaged into an arcuate form on a certain surface perpendicular to the rotational symmetry axis. Conversely, an arcuate object on said certain surface may form a spot image at the position whereat the spot object is disposed.

7 Claims, 12 Drawing Figures

IMAGE FORMING OPTICAL SYSTEM

This is a continuation of application Ser. No. 18,910, filed Mar. 9, 1979, now abandoned.

BACKGROUND OF THE INVENTION

1. Field of the Invention

This invention relates to an image forming optical system using a concave spherical mirror, and more particularly to an image forming optical system for converting a spot object into an arcuate image or an arcuate object into a spot image.

2. Description of the Prior Art

In an optical apparatus, there are some cases where an arcuate image is required. For example, in the printer for making semiconductor circuits disclosed in U.S. Pat. No. 3,963,353, a thin arcuate light source image on a mask is required as the means for illuminating the mask.

Usually, when an arcuate light source image is to be obtained, the light source must be arcuate in shape. Where a heating resistor such as tungsten lamp or the like is used, an arcuate light source may be relatively easily obtained by making the heating resistor arcuate in shape. However, a light source using such a heating resistor, because of its generally low brightness and the difficulty with which ultraviolet light is obtained from such light source, is not suitable for use with a printer which uses ultraviolet rays as the printing light due to the characteristic of photosensitive material.

As a light source which is high in brightness and from which ultraviolet rays may be obtained, there are gas discharge tubes such as xenon or mercury lamps. To make such a gas discharge tube into an arcuate light source, the glass tube must be made into an arcuate form. The glass working required to make the glass tube into an arcuate form is very difficult and the resultant arcuate gas discharge tube becomes expensive. The light source is a consumption article and particularly, the gas discharge tube having a high brightness is short in service life and this leads to the disadvantage of high running cost. Therefore, to obtain an arcuate light source image of high brightness, a spot light source must be used and made into an arcuate form by an optical system. Although somewhat different in meaning, a method of obtaining an arcuate light beam is disclosed in Japanese Patent Publication No. 13477/1973. According to this method, a conical mirror is optically sectioned along two planes orthogonal to the conical line thereof to obtain a band-like conical mirror and a light beam having a certain point as the origin of deviation is caused to impinge on such band-like conical mirror. The locus of the light beam on the scanning surface becomes an arcuate form centered at the conical line. However, the circular arc formed by such band-like conical mirror becomes wide in radial direction. This is because the reflecting surface of the band-like conical mirror has no curvature in the plane containing the conical line of such mirror and this reflecting surface has no converging action.

U.S. Pat. No. 3,758,774 discloses an image forming optical system for converting a spot light source into a linear light source image by the use of a paraboloidal or parabolic mirror. However, this U.S. Patent does not refer to an optical system for converting a spot light source into an arcuate light source image.

SUMMARY OF THE INVENTION

It is therefore an object of the present invention to provide an image forming optical system which is capable of converting a spot object or an arcuate object into an arcuate image or a spot image. Such an object may be achieved by optically sectioning a spherical mirror and by bringing into a special relationship a point on the rotational symmetry axis other than the center of curvature of the spherical surface of the band-like spherical mirror and an arcuate area on a plane which is perpendicular to said rotational symmetry axis and on which a meridional light beam is imaged.

The term "optically sectioning a spherical mirror" means not only physically sectioning a spherical mirror but also an action equivalent to the physical sectioning such as, for example, covering the other portion of the spherical mirror than the band-like portion thereof with a non-reflective paint or the like. The meridional light beam refers to a light beam in a cross-sectional plane containing the rotational symmetry axis of the spherical mirror. Further, a sagittal light beam which will hereinafter be referred to means a light beam in a cross-sectional plane orthogonal to the meridional section, namely, a cross-section perpendicularly sectioning the rotational symmetry axis.

The invention will become more fully apparent from the following detailed description thereof taken in conjunction with the accompanying drawings.

DESCRIPTION OF THE PREFERRED EMBODIMENTS

Figure 1:
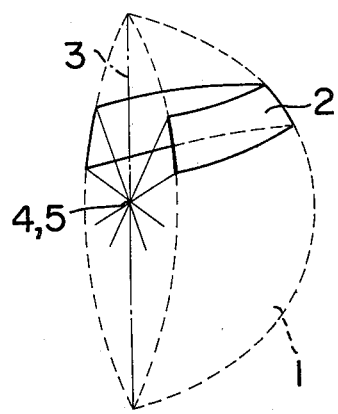
FIG. 1 is a view for illustrating a band-like spherical mirror.

FIG. 1 illustrates the nature of a band-like spherical mirror.

Figure 2:
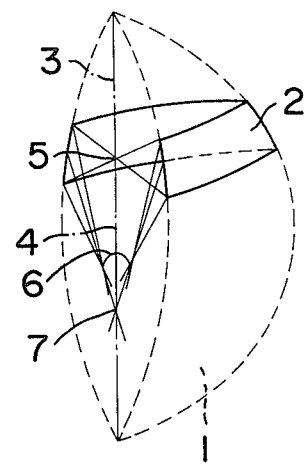
FIG. 2 shows a first embodiment of the image forming optical system using the band-like spherical mirror of the present invention.

Designated by 1 is a concave spherical mirror, and designated by 2 is a band-like spherical mirror sectioned along an unshown plane perpendicular to the rotational symmetry axis 3 of the spherical mirror 1 and spaced apart a certain interval. Denoted by 4 is the center of the spherical mirror 1. Assuming that a spot light source 5 is disposed at the center 4, the light travelling from the spot light source 5 toward the band-like spherical mirror 2 is reflected by the band-like spherical mirror 2 and again converged at the spot light source 5. If the spot light source 5 is disposed at any point on the rotational symmetry axis other than the center 4, as shown in FIG. 2, then there is obtained an arcuate image 6. That is, where the spot light source 5 is disposed at the center 4 of the sphere, as shown in FIG. 1, the positional relation between the spot light source and the band-like spherical surface is equal on the previously defined sagittal section and the meridional section, but where the spot light sorce 5 is disposed at any point on the rotational symmetry axis 3 other than the center 4 of the sphere, as shown in FIG. 2, said positional relation differs on the sagittal section and the meridional section. Therefore, the sagittal light beam is not imaged on a plane on which the meridional light beam is imaged in the meridional section, which plane is perpendicular to the rotational symmetry axis. Thus, there is provided an arcuate image of the light source. It will be noted that the point 7 on the rotational symmetry axis 3 is a location conjugate with the spot light source 5 in the sagittal section. The meridional light beam in the meridional section is imaged on a section perpendicular to the rotational symmetry axis 3 because an approximate circle approximate to an ellipse having the spot light source and the image-forming point of the meridional light beam as two focuses is coincident with the meridional section of the spherical surface 2.

Also, in FIG. 2, if an object identical to the light souce image is disposed at the postion of this light source image 6, the image of this object will be formed at the position of the spot light source 5.

Figure 3:
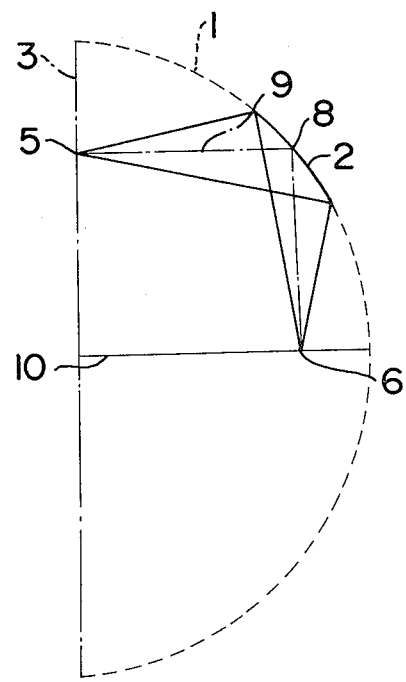
FIG. 3 shows a second embodiment of the image-forming optical system according of the present invention.

FIG. 3 shows a second embodiment of the present invention and illustrates a meridional section. In this embodiment, the spherical mirror 1 is sectioned along said two planes so that the tangential line at the center 8 of the band-like spherical mirror intersects the axis 3 at 45°, and the light source 5 is disposed at the point whereat the line passing through this center 8 is orthogonal with the axis 3. With such an arrangement, the principal ray 9 from the spot light source 5 is bent at a right angle by the band-like spherical mirror 2 and enters the image forming plane 10 perpendicularly thereto. This image forming system may be referred as to a so-called telecentric optical system because the principal ray enters the image forming plane perpendicularly thereto.

Figure 4A:
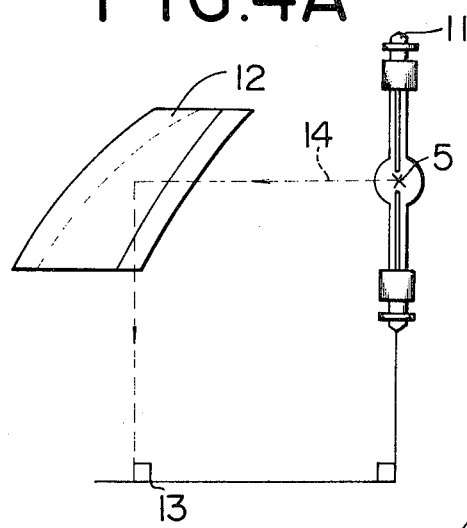
FIGS. 4A–4C show front, side and plan views of an application of the FIG. 3 optical system to an illuminating system.
Figure 4B:
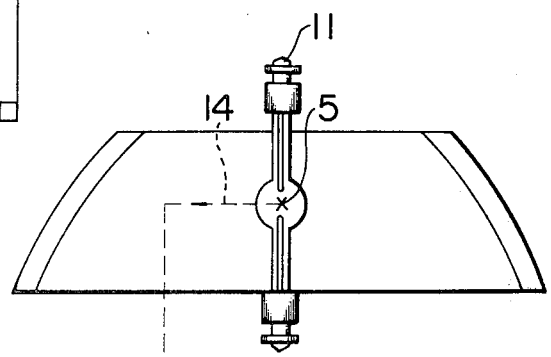
Figure 4C:
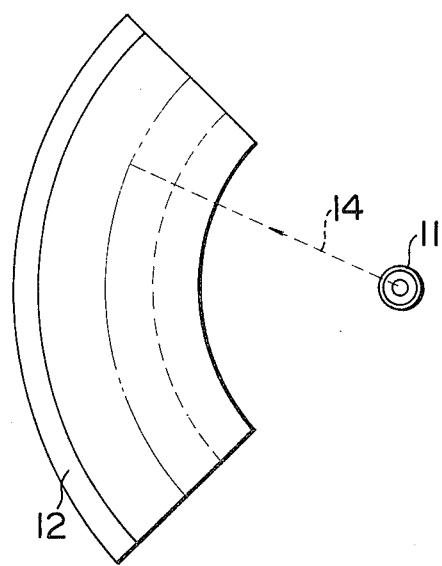

Reference is now had to FIG. 4 to describe an embodiment in which the image forming optical system of FIG. 3 is applied at an illuminating position.

FIG. 4 (a) is a front view, FIG. 4 (b) is a side view and FIG. 4 (c) is a plan view. A spot light source 11 such as a short arc ultra-high tension mercury lamp or the like has electrical connection termimals at the upper and lower portions thereof and a glass tube is present between the two terminals, and electrodes connected from the opposite ends are placed within the glass tube and spaced apart over a certain short distance. The interior of the glass tube is filled with gas so that discharge may occur between the electrodes by applying the turned-on light source to the opposite ends, whereby light may be emitted between the electrodes. This light-emitting point is designated at 5. Reference numeral 12 designates a band-like spherical mirror and 13 an illuminating surface, and these correspond to the reference characters 2 and 10 in FIG. 3. Thus, the principal ray 14 from the spot light source 5 travels parallel to the illuminating surface 13 and is bent at a right angle by the band-like spherical mirror and enters the illuminating surface 13 perpendicularly thereto. Thus, an arcuate image of the light source is formed on the illuminating surface 13.

Description has hitherto been made with respect to a band-like spherical mirror obtained by sectioning a spherical mirror along two planes orthogonal to the rotational symmetry axis, and this is because the obtained arcuate image of the light source must be of a uniform brightness along a circular arc. For example, where an arcuate image of the light source having a higher brightness at the peripheral portion than at the central portion of the circular arc is desired, this may be realized by making the size of the band-like spherical mirror in the direction of the rotational symmetry axis thereof larger at the peripheral portion than at the central portion. In this case, the spherical mirror need not be sectioned along the two planes orthogonal to the rotational symmetry axis. Also, the position of the spot light source has been defined as a point on the rotational symmetry axis other than the center of curvature, but depending on the quality of the desired image of the light source, the position of the spot light source may be somewhat deviated from such point. This also holds true of the position of the image plane.

Figure 5A:
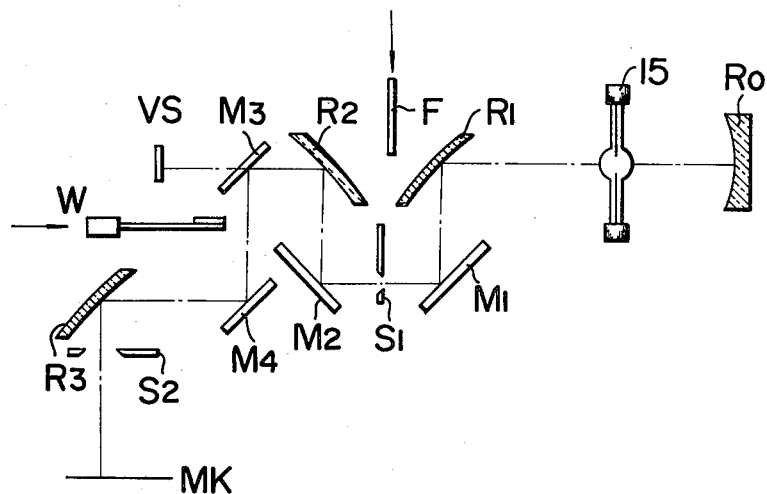
FIG. 5A is a view showing the illumination system.
Figure 5B:
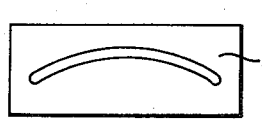
FIGS. 5B and 5C are views of the slit plates of FIG. 5A.
Figure 5C:
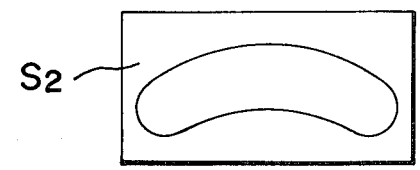
Figure 5D:
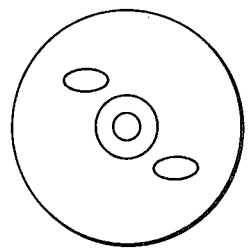
FIGS. 5D and 5E are views showing the image of a light source on a viewing screen.
Figure 5E:
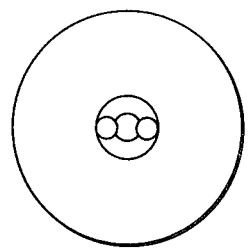

Description will now be made with respect to a case where the image forming system of the present invention is applied to the illuminating system of a printer such as IC, LSI, VLSI or the like. Such illuminating system uses the image forming system of FIG. 3, namely, a telecentric image forming system. FIG. 5 shows the optical arrangement of the illuminating system. FIG. 5(a) is a view showing the construction of the entire system, FIG. 5(b) is a view showing a slit $S_1$, FIG. 5(c) is a view showing a slit $S_2$, and FIGS. 5(d) and (e) are views showing the image of a light source 15 on a viewing screen VS.

In FIG. 5, reference character 15 designates an ultra-high tension mercury lamp, and $R_o$ is a spherical refelctive mirror which may form the image of the spot light source along with the spot light source which is the mercury lamp. $R_1$ is a telecentric band-like spherical mirror. $M_1$ denotes a conventional mirror, and $S_1$ is a slit plate having an arcuate opening as shown in FIG 5(b). An arcuate image of the light source is formed on the surface of this slit plate $S_1$. By varying the radial length and the length in the direction of circular arc of the opening of the slit $S_1$, it is possible to adjust the radial length and the length in the direction of circular arc of the arcuate image of the light source on a mask which will hereinafter be described. Denoted by F is a printing light cut filter instead into the slit plate $S_1$ during the alignment between a mask and a wafer. $M_2$ is a conventional mirror and $R_2$ is an entrance side telecentric band-like spherical mirror for replacing the opening of the slit $S_1$ by a spot-like image. $M_3$ is a partly transmitting mirror. W is a shutter lying on a plane formed by the spot-like image of the slit $S_1$ and may be positioned on the spot-like image when it is desired to stop illuminating the mask. A screen VS is provided on a plane conjugate with the position whereat the spot-like image is formed with respect to the partly transmitting mirror $M_3$. Thus, an image of the actual light source and an image of the light source formed by the spherical mirror $R_o$ are formed on the screen VS. Therefore, by providing a sight on the screen as shown in FIGS. 5(d) and (e) and by determining the condition in which two images of the light source are within the sight as the time of alignment of the optical system, it is possible to use the screen for the adjustment of any misalignment as shown in FIG. 5(d). $M_4$ is a mirror and $R_3$ is an exit side telecentric band-like spherical mirror for causing the spot image formed by the band-like spherical $R_2$ to be again formed as an arcuate image on the mask MK. $S_2$ is a slit having an arcuate opening, as shown in FIG. 5(c), for controlling the numerical aperture of the light beam impinging on the mask MK. The image forming performance of a projecting optical system shown in FIG. 6 is somewhat varied with the ratio of the numerical aperture of such light beam to the numerical aperture of this projecting optical system and it is therefore important to determine the value of the width of this slit.

Figure 6:
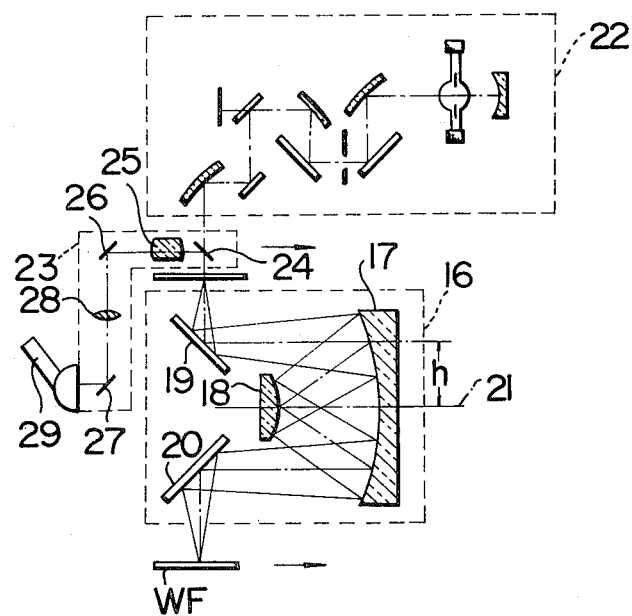
FIG. 6 shows an optical arrangement in an application of the second embodiment of the image forming optical system to a printer apparatus.

Reference is now had to FIG. 6 to describe an apparatus with which a mask illuminated by such an illuminating system is printed on a wafer. In FIG. 6, the optical arrangement of FIG. 5(a) is generally designated by 22.

FIG. 6 shows a printing apparatus using a catoptric system of unit magnification as disclosed in U. S. Pat. No. 3,963,353. The portion designated by 16 is the catoptric system (projecting optical system) of unit magnification. A concave mirror 17 and a convex mirror 18 (the curvature radius of the convex surface is one-half of the curvature radius of the concave surface) are disposed with their centers of curvature coincident, and the light path is bent by plane mirrors 19 and 20, and the mask surface MK and the wafer surface WF are in a 1 to 1 image forming relationship. Details of this optical system are described in the aforementioned U.S. Patent and need not be described herein. However, simply mentioning the features of this optical system, it is constructed by mirrors and has therefore no chromatic aberration and since no abberation is present only at a certain image height h, an optimum position lies on a circular circumference of radius h with respect to the optic axis 21 of the mirrors 17, 18 and, with the exposure through the arcuate slit and with the mask MK and the wafer WF being integral (the others being fixed), the whole surface printing is effected by moving an exposure movable stage in the direction of the arrow and it is thus possible to print large-sized wafers WF.

The illuminating optical system is disposed on the catoptric system 16, as indicated at 22, and the details thereof are the same as those shown in FIG. 5(a). (In FIG. 6, part of the illuminating optical system is omitted.)

An observation optical system 23 is inserted between the catoptric system 16 and the illuminating optical system 22. The observation optical system is used for the aligning of the mask MK and the wafer and comprises a half-mirror 24, an objective lens 25, plane mirrors 26, 27, a relay lens 28 and an eye piece 29. When the arcuate light beam from the illuminating optical system 22 passes through the half-mirror 24 to illuminate the mask MK, the light beam passes through the mask MK and illuminates the wafer WF with the aid of the catoptric system and the scattered light on the wafer WF is again imaged on the mask MK by the catoptric system so that the imge of the mask MK is overlapped with the image of the wafer WF, and as soon as the focus position of the observation optical system is brought onto the mask MK, the mask MK and the wafer WF may be observed.

The wafer WF is coated with photoresist and during the observation, light of a wavelength which does not sensitize is used and during the printing, light of a wavelength which sensitizes is used. Therefore, the filter of FIG. 5(a filter passing therethrough the light of a wavelength which does not sensitize and intercepting the light of a wavelength which sensitizes) is inserted and the observation optical system is disposed as shown in FIG. 6, and an alignment movable step (not shown) for moving the holder of the mask MK or the wafer WF is moved while observing through the observation optical system to align the mask MK and the wafer WF into a predetermined relationship. Next, the printing may occur, but before that, the observation optical system is removed to prevent the quantity of light from being lost by the half-mirror 24, and the mask MK and wafer WF are integrally moved toward one side, and then the filter F is removed. The printing is effected with the mask MK and the wafer WF being integrally moved at an equal velocity. This velocity may be varied with the illumination on the mask MK, the radial interval of the arcuate slit and the sensitivity of the photoresist. This apparatus is particularly useful for the printing of fine patterns.

One to three spherical mirrors have been used in the optical system described hitherto, but it is evident that two or three or more spherical mirrors may be used. The curvature radii of the spherical mirrors need not always be equal to each other. For example, the radius of the circular are may be varied by varying the radius of the $R_3$ in FIG. 5(a).

What is claimed is:

1. An image forming optical system using a concave spherical mirror, said system comprising a band-like spherical mirror obtained by optically sectioning the concave spherical mirror, said band-like spherical mirror enabling the meridional light beam from a spot object on the rotational symmetry axis other than the center of curvature of the spherical surface of said band-like spherical mirror to be imaged on a predetermined surface perpendicular to said rotational symmetry axis, causing a sagittal light beam not to be imaged and enabling an arcuate image centered at said rotational symmetry axis to be obtained on said predetermined surface.

2. An image forming optical system using a concave spherical mirror, said system comprising a band-like spherical mirror obtained by optically sectioning the concave spherical mirror, said band-like spherical mirror enabling the principal ray from each point of a predetermined arcuate object centered at the rotational symmetry axis on a predetermined surface perpendicular to the rotational symmetry axis to be condensed at a point on said rotational symmetry axis other than the center of curvature of the spherical surface of said band-like spherical mirror and enabling the meridional light beam from said arcuate object to be imaged at a point on said rotational symmetry axis.

3. An optical system for converting a spot light source into an arcuate light source image, comprising:
   a spot light source;
   a band-like spherical mirror obtained by optically sectioning a concave spherical mirror, said spot light source being substantially positioned at a point other than the center of curvature on the rotational symmetry axis of said band-like spherical mirror; and
   an illuminating surface substantially perpendicular to said rotational symmetry axis.

4. A printer apparatus comprising:
   a member for supporting a mask;
   a member for supporting a wafer;
   a unit magnification projecting optical system for forming the image of the mask on the wafer;
   means for integrally moving the mask and the wafer with respect to the unit magnification projecting optical system; and means for illuminating the mask, said means having a spot light source and means for converting said spot light source into an arcuate light source image.

5. A printer apparatus comprising:

a member for supporting a mask;

a member for supporting a wafer;

a unit magnification projecting optical system for forming the image of the mask on the wafer, said optical system having a substantially abberation-free, arcuate area;

means for integrally moving the mask and the wafer with respect to the unit magnification projecting optical system; and means for illuminating the mask, said means having a spot light source and means for converting said spot light source into an arcuate light source image.

6. An apparatus according to claim 5, wherein, said converting means includes a band-like mirror having a surface which is curved when viewed in orthogonal cross-sections thereof.

7. An apparatus according to claim 5, wherein said converting means includes a band-like mirror having a surface of revolution.

* * * * *

UNITED STATES PATENT AND TRADEMARK OFFICE
CERTIFICATE OF CORRECTION

PATENT NO. : 4,294,538

DATED : October 13, 1981

INVENTOR(S) : MIKICHI BAN

It is certified that error appears in the above—identified patent and that said Letters Patent is hereby corrected as shown below:

Column 3, line 38, after "referred" insert --to--; line 39, delete "to".

Column 4, line 46, "instead" should be --inserted--; line 67, after "spherical", insert --mirror--.

Column 5, line 46, after "wafer" insert --WF--; line 68, "step" should be --stage--.

Signed and Sealed this

Twenty-sixth Day of January 1982

[SEAL]

Attest:

GERALD J. MOSSINGHOFF

*Attesting Officer*  Commissioner of Patents and Trademarks